US009373601B2

(12) United States Patent
Lee et al.

(10) Patent No.: US 9,373,601 B2
(45) Date of Patent: Jun. 21, 2016

(54) SEMICONDUCTOR SUBSTRATE, SEMICONDUCTOR PACKAGE STRUCTURE AND METHOD OF MAKING THE SAME

(71) Applicant: Advanced Semiconductor Engineering, Inc., Kaohsiung (TW)

(72) Inventors: Chih-Cheng Lee, Kaohsiung (TW); Yuan Chang Su, Kaohsiung (TW); Cheng-Lin Ho, Kaohsiung (TW); Chung-Ming Wu, Kaohsiung (TW); You-Lung Yen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/700,060

(22) Filed: Apr. 29, 2015

(65) Prior Publication Data

US 2015/0348931 A1 Dec. 3, 2015

(30) Foreign Application Priority Data

May 29, 2014 (CN) .......................... 2014 1 0234083

(51) Int. Cl.
*H01L 23/00* (2006.01)
*H01L 21/48* (2006.01)
(Continued)

(52) U.S. Cl.
CPC .............. *H01L 24/17* (2013.01); *H01L 21/486* (2013.01); *H01L 21/4853* (2013.01); *H01L 21/565* (2013.01); *H01L 21/6835* (2013.01); *H01L 21/76801* (2013.01); *H01L 21/76877* (2013.01);
(Continued)

(58) Field of Classification Search
CPC .............. H01L 21/4853; H01L 21/486; H01L 21/76802; H01L 23/49827; H01L 23/49811; H01L 23/49833; H01L 23/5226; H01L 24/14; H01L 24/17; H01L 24/81; H01L 24/82; H01L 2221/68359; H01L 2221/68372; H01L 2224/16112; H01L 2224/16113; H01L 2224/16235; H01L 2224/17; H01L 24/19; H01L 23/3128
USPC .......... 257/693, 700, 778, E23.019, E23.067, 257/E23.068, E23.069, E23.145, E23.169; 438/106, 107, 121, 125, 456, 457, 612, 438/618, 652, 669, 622
See application file for complete search history.

(56) References Cited

U.S. PATENT DOCUMENTS 6,667,552 B1 * 12/2003 Buynoski .......... H01L 21/32053
257/758
7,939,935 B2 5/2011 Chinda et al.
(Continued)

*Primary Examiner* — Jasmine Clark
(74) *Attorney, Agent, or Firm* — Foley & Lardner LLP; Cliff Z. Liu; Angela D. Murch

(57) ABSTRACT

The present disclosure relates to a semiconductor substrate, a semiconductor package structure, and methods for making the same. A method includes providing a substrate and a carrier layer. The substrate includes a first patterned metal layer, a second patterned metal layer spaced from the first patterned metal layer, and a dielectric layer disposed between the first patterned metal layer and the second patterned metal layer. The dielectric layer covers the second patterned metal layer. The dielectric layer defines first openings exposing the second patterned metal layer, and further defines a via opening extending from the first patterned metal layer to the second patterned metal layer. A conductive material is disposed in the via and electrically connects the first patterned metal layer to the second patterned metal layer. The carrier layer defines second openings exposing the second patterned metal layer.

20 Claims, 9 Drawing Sheets

(51) Int. Cl.
  *H01L 21/768* (2006.01)
  *H01L 21/683* (2006.01)
  *H01L 21/56* (2006.01)
  *H01L 23/498* (2006.01)
  *H01L 23/31* (2006.01)

(52) U.S. Cl.
  CPC ...... *H01L 23/3107* (2013.01); *H01L 23/49811* (2013.01); *H01L 23/49827* (2013.01); *H01L 24/11* (2013.01); *H01L 24/81* (2013.01); *H01L 2221/68359* (2013.01); *H01L 2221/68372* (2013.01); *H01L 2224/11334* (2013.01); *H01L 2224/16113* (2013.01); *H01L 2224/16235* (2013.01); *H01L 2224/81801* (2013.01)

(56) References Cited

U.S. PATENT DOCUMENTS

| | | | |
|---|---|---|---|
| 8,344,749 B2 | 1/2013 | Stillman et al. | |
| 2007/0275503 A1* | 11/2007 | Lin | C25D 3/48 438/106 |
| 2008/0001290 A1* | 1/2008 | Chou | H01L 23/53238 257/751 |

* cited by examiner

SEMICONDUCTOR SUBSTRATE, SEMICONDUCTOR PACKAGE STRUCTURE AND METHOD OF MAKING THE SAME

CROSS-REFERENCE TO RELATED PATENT APPLICATIONS

This application claims the benefit of Chinese Patent Application No. 201410234083.0, filed on May 29, 2014, the content of which is incorporated herein by reference in its entirety.

BACKGROUND

1. Technical Field

The present disclosure relates to a semiconductor substrate, a semiconductor package structure and a method of making the same.

2. Description of the Related Art

Dielectric layers of a semiconductor substrate may be made from pre-impregnated (pre-preg) composite fibers. However, pre-preg mainly includes resin and glass fiber, so a relatively thick pre-preg dielectric layer is used to obtain a desired structural strength of the substrate. Thus, the use of pre-preg dielectric layers may increase a thickness of the substrate.

SUMMARY

In accordance with an embodiment of the present disclosure, a method of making a semiconductor substrate includes: providing a substrate and providing a carrier layer on a dielectric layer of the substrate. The substrate includes a first patterned metal layer; a second patterned metal layer spaced from the first patterned metal layer, and the dielectric layer. The dielectric layer is disposed between the first patterned metal layer and the second patterned metal layer and covers the second patterned metal layer. The dielectric layer defines first openings exposing the second patterned metal layer, and further defines a via opening extending from the first patterned metal layer to the second patterned metal layer. A conductive material is disposed in the via, and electrically connects the first patterned metal layer to the second patterned metal layer. The carrier layer defines second openings exposing the second patterned metal layer.

In accordance with an embodiment of the present disclosure, a method of making a semiconductor package structure includes providing a semiconductor substrate. The semiconductor substrate includes a first patterned metal layer, a second patterned metal layer spaced from the first patterned metal layer, a dielectric layer disposed between the first patterned metal layer and the second patterned metal layer and covering the second patterned metal layer, and a carrier layer. The dielectric layer defines first openings exposing the second patterned metal layer, and further defines a via opening extending from the first patterned metal layer to the second patterned metal layer. A conductive material is disposed in the via opening and electrically connects the first patterned metal layer to the second patterned metal layer. The carrier layer abuts the dielectric layer and defines second openings exposing the second patterned metal layer. The method also includes electrically connecting a die to the first patterned metal layer and removing the carrier layer.

In accordance with an embodiment of the present disclosure, a semiconductor package structure includes a semiconductor substrate and a die. The semiconductor substrate includes a first patterned metal layer; a second patterned metal layer spaced from the first patterned metal layer, and a dielectric layer disposed between the first patterned metal layer and the second patterned metal layer. The dielectric layer covers the second patterned metal layer. The dielectric layer has a rough surface. The dielectric layer defines first openings exposing the second patterned metal layer, and further defines a via opening extending from the first patterned metal layer to the second patterned metal layer. A conductive material is disposed in the via opening and electrically connects the first patterned metal layer to the second patterned metal layer. The die is electrically connected to the first patterned metal layer.

BRIEF DESCRIPTION OF THE DRAWINGS

The disclosure will be described according to the appended drawings in which.

DETAILED DESCRIPTION

Figure 1A:
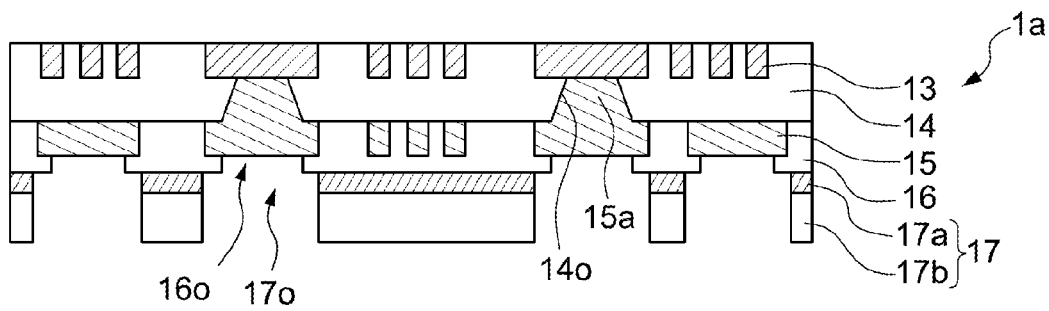
FIG. 1A is a schematic diagram of a semiconductor substrate according to an embodiment of the present disclosure.

FIG. 1A is a schematic diagram of a semiconductor substrate according to an embodiment of the present disclosure. As shown in FIG. 1A, a semiconductor substrate 1a includes a first patterned metal layer 13, a first dielectric layer 14, a via opening 14o, a second patterned metal layer 15, a conductive material 15a disposed within the via opening 14o, a second dielectric layer 16 and a carrier layer 17.

The first patterned metal layer 13 may include, but is not limited to, copper or other metal, or a metal alloy. A pitch of traces of the first patterned metal layer 13 may be equal to or less than about 15 micrometers (μm), and a width of traces of the first patterned metal layer 13 may be equal to or less than about 15 μm. In one or more embodiments, a minimum trace pitch and a minimum trace width are approximately equal; however, in one or more other embodiments, a minimum trace pitch and a minimum trace width are unequal. The first patterned metal layer 13 has a thickness from about 5 μm to about 20 μm, such as about 5 μm to about 15 μm, or about 5 μm to about 10 μm.

The second patterned metal layer 15 is disposed under the first patterned metal layer 13. The second patterned metal layer 15 may include, but is not limited to, copper or other metal, or a metal alloy. The first patterned metal layer 13 may include one or more of the same materials as the second patterned metal layer 15; however, some or all of the materials of the first patterned metal layer 13 the second patterned metal layer 15 may be different. The second patterned metal layer 15 has a thickness from about 5 µm to about 30 µm, such as about 5 µm to about 25 µm, about 5 µm to about 20 µm, about 5 µm to about 15 µm, or about 5 µm to about 10 µm.

The first dielectric layer 14 is disposed between the first patterned metal layer 13 and the second patterned metal layer 15. The first dielectric layer 14 has a thickness from about 10 µm to about 100 µm, such as about 10 µm to about 90 µm, about 10 µm to about 80 µm, about 10 µm to about 70 µm, about 10 µm to about 60 µm, about 10 µm to about 50 µm, about 10 µm to about 40 µm, about 10 µm to about 30 µm, or about 10 µm to about 20 µm. The first dielectric layer 14 may include, but is not limited to, one or more of a photosensitive material which is cured during manufacturing, such as a solder resist or a polyimide, a resin or another material which is applied in liquid or semi-liquid form and is cured during manufacturing, and a dry-film insulating material. The first patterned metal layer 13 is exposed from an upper surface of the first dielectric layer 14, and an upper surface of the first patterned metal layer 13 may be coplanar or substantially coplanar with the upper surface of the first dielectric layer 14. The first dielectric layer 14 includes at least one via opening 14o.

The at least one via opening 14o extends from the first patterned metal layer 13 to the second patterned metal layer 15. The via opening 14o has a diameter between about 10 µm to about 150 µm, such as about 10 µm to about 100 µm, about 10 µm to about 50 µm about 10 µm to about 40 µm, about 10 µm to about 30 µm, or about 10 µm to about 20 µm.

The conductive material 15a may be, but is not limited to, copper or other metal, or a metal alloy. The conductive material 15a may include one or more of the same materials as the first patterned metal layer 13 or the second patterned metal layer 15; however, some or all of the materials of the first patterned metal layer 13, the second patterned metal layer 15 and the conductive material 15a may be different. The conductive material 15a is disposed in the at least one via opening 14o so as to electrically connect the first patterned metal layer 13 and the second patterned metal layer 15. In one or more embodiments of the present disclosure, the conductive material 15a may be integrally formed with the second patterned metal layer 15.

The second dielectric layer 16 abuts the first dielectric layer 14. The second dielectric layer 16 encapsulates the second patterned metal layer 15. The second dielectric layer 16 may include, but is not limited to, one or more of a photosensitive material which is cured during manufacturing, such as a solder resist or a polyimide, a resin or another material which is applied in liquid or semi-liquid form and is cured during manufacturing, and a dry-film insulating material. The second dielectric layer 16 may include one or more of the same materials as the first dielectric layer 14; however, some or all of the materials of the first dielectric layer 14 and the second dielectric layer 16 may be different. In one or more embodiments, the second dielectric layer 16 has a thickness from about 10 µm to about 30 µm, such as about 10 µm to about 25 µm, about 10 µm to about 20 µm, or about 10 µm to about 15 µm. The second dielectric layer 16 includes multiple first openings 16o to expose the second patterned metal layer 15. Each of the first openings 16o may have a diameter from about 100 µm to about 1000 µm, such as about 100 µm to about 900 µm, about 100 µm to about 800 µm, about 100 µm to about 700 µm, about 100 µm to about 600 µm, about 100 µm to about 500 µm, about 100 µm to about 400 µm, about 100 µm to about 300 µm, about 100 µm to about 200 µm.

In one or more embodiments, one or both of the first dielectric layer 14 and the second dielectric layer 16 may be formed of a film type insulating material, a material applied in liquid or semi-liquid form and dried during manufacturing, or other material not containing glass fibers, and thus a semiconductor substrate with a reduced thickness may be obtained as compared to a semiconductor substrate in which the first dielectric layer 14 and/or the second dielectric layer 16 are materials including glass fibers.

The carrier layer 17 abuts the second dielectric layer 16. The carrier layer 17 may be closely attached or laminated to the second dielectric layer 16.

The carrier layer 17 includes multiple second openings 17o. A position of each of the second openings 17o substantially corresponds to a position of a respective first opening 16o. A diameter of each of the second openings 17o is greater than or equal to a diameter of the respective first opening 16o. Each of the second openings 17o may have a diameter from about 100 µm to about 1500 µm, such as about 100 µm to about 1000 µm, about 100 µm to about 900 µm, about 100 µm to about 800 µm, about 100 µm to about 700 µm, about 100 µm to about 600 µm, about 100 µm to about 500 µm, about 100 µm to about 400 µm, about 100 µm to about 300 µm, or about 100 µm to about 200 µm. The first openings 16o and the second openings 17o may be sized to allow a probe to pass so as to conduct electrical testing.

The carrier layer 17 may be a single-layer structure or a multi-layer structure. For example, a multi-layer structure carrier layer 17 may include a third patterned metal layer 17a and a supporting layer 17b. In this embodiment, the third patterned metal layer 17a abuts the second dielectric layer 16. The third patterned metal layer 17a may include, but is not limited to, copper or other metal, or a metal alloy. The third patterned metal layer 17a may include one or more of the same materials as the first patterned metal layer 13, the second patterned metal layer 15 or the conductive material 15a; however, some or all of the materials of the first patterned metal layer 13, the second patterned metal layer 15, the third patterned metal layer 17a and the conductive material 15a may be different. The third patterned metal layer 17a may have a thickness from about 2 µm to about 7 µm, such as about 2 µm to about 6 µm, about 2 µm to about 5 µm, about 2 µm to about 4 µm, or about 2 µm to about 3 µm. Further in the example of the multi-layer structure carrier layer 17, the supporting layer 17b abuts the third patterned metal layer 17a. The supporting layer 17b may include, but is not limited to, BT (bismaleimide triazine) resin or glass-reinforced epoxy material (e.g., an FR4 material). The supporting layer 17b may have a thickness from about 40 µm to about 400 µm, such as about 40 µm to about 300 µm, about 40 µm to about 200 µm, about 40 µm to about 100 µm, about 40 µm to about 90 µm, about 40 µm to about 80 µm, about 40 µm to about 70 µm, about 40 µm to about 60 µm, or about 40 µm to about 50 µm. The supporting layer 17b is used for enhancing a strength of the semiconductor substrate 1a to facilitate a subsequent packaging process. The third patterned metal layer 17a is used to facilitate separation of the carrier layer 17 from a semiconductor package body after packaging.

Figure 1B:
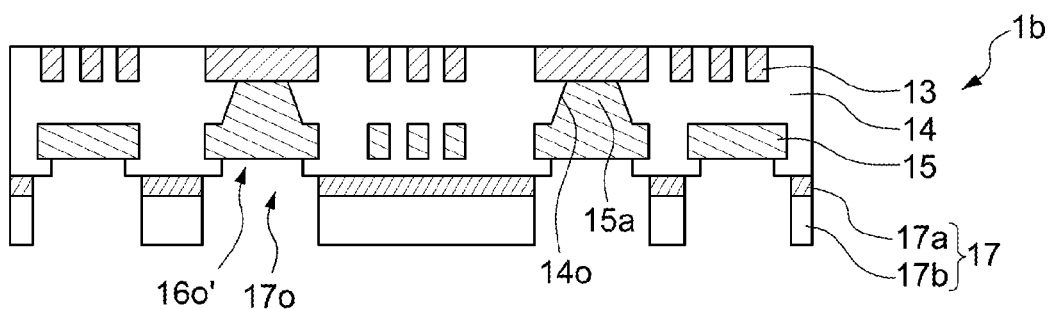
FIG. 1B is a schematic diagram of a semiconductor substrate according to another embodiment of the present disclosure.

FIG. 1B is a schematic diagram of a semiconductor substrate 1b according to another embodiment of the present disclosure. The semiconductor substrate 1b has a structure similar to that of the semiconductor substrate 1a in FIG. 1A, and the difference lies in that the first dielectric layer 14 and the second dielectric layer 16 in the semiconductor substrate 1a are replaced with a single dielectric layer 14 in the semiconductor substrate 1b, that is, the second dielectric layer 16 and the first dielectric layer 14 are formed of the same material. For example, when the second dielectric layer 16 and the first dielectric layer 14 are solder resist, because the solder resist is a thermoplastic material and has moisture absorption characteristics, a first solder resist (e.g., the first dielectric layer 14) may absorb moisture and thus not fully cure prior to application of a next second solder resist (e.g., the second dielectric layer 16); thus, the first solder resist and the second solder resist may cure at the same time and fuse together, forming the single dielectric layer 14.

In the embodiment illustrated in FIG. 1B, the dielectric layer 14 is disposed between the first patterned metal layer 13 and the second patterned metal layer 15, and encapsulates the second patterned metal layer 15. The dielectric layer 14 includes multiple first openings 16o' to expose the second patterned metal layer 15. The dielectric layer 14 includes at least one that extends from the first patterned metal layer 13 to the second patterned metal layer 15. The first openings 16o' and the second openings 17o may be sized to allow a probe to pass so as to conduct electrical testing.

Figure 2A:
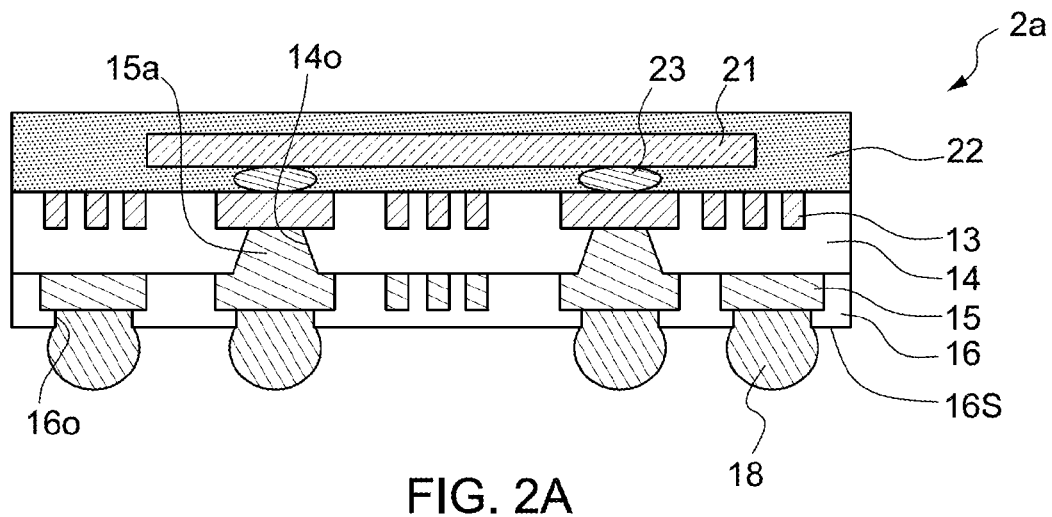
FIG. 2A is a schematic diagram of a semiconductor package structure according to an embodiment of the present disclosure.

FIG. 2A is a schematic diagram of a semiconductor package structure according to an embodiment of the present disclosure. As shown in FIG. 2A, a semiconductor package structure 2a includes a first patterned metal layer 13, a first dielectric layer 14, a second patterned metal layer 15, a second dielectric layer 16, multiple solder balls 18, a die 21 and a molding compound 22.

A semiconductor substrate included in the semiconductor package structure 2a may be similar to the semiconductor substrate 1a shown in FIG. 1A, and the difference lies in that the semiconductor substrate included in the semiconductor package structure 2a does not have the carrier layer 17' of the semiconductor substrate 1a.

The solder balls 18 are disposed in respective first openings 16o of the second dielectric layer 16. A surface roughness (Ra) of a lower surface 16S of the second dielectric layer 16 is greater than about 0.15 μm. In one or more embodiments of the present disclosure, the lower surface 16S has a surface roughness from about 0.2 μm to about 1.0 μm, such as about 0.4 μm to about 1.0 μm, about 0.6 μm to about 1.0 μm, or about 0.8 μm to about 1.0 μm.

The die 21 may include one or more connecting elements 23. A connecting element 23 may be, for example, a copper pillar or a solder bump. The die 21 may be bonded to the first patterned metal layer 13 through the connecting element 23, such that the die 21 is electrically connected to the first patterned metal layer 13. The molding compound 22 encapsulates the die 21 and the connecting elements 23.

Figure 2B:
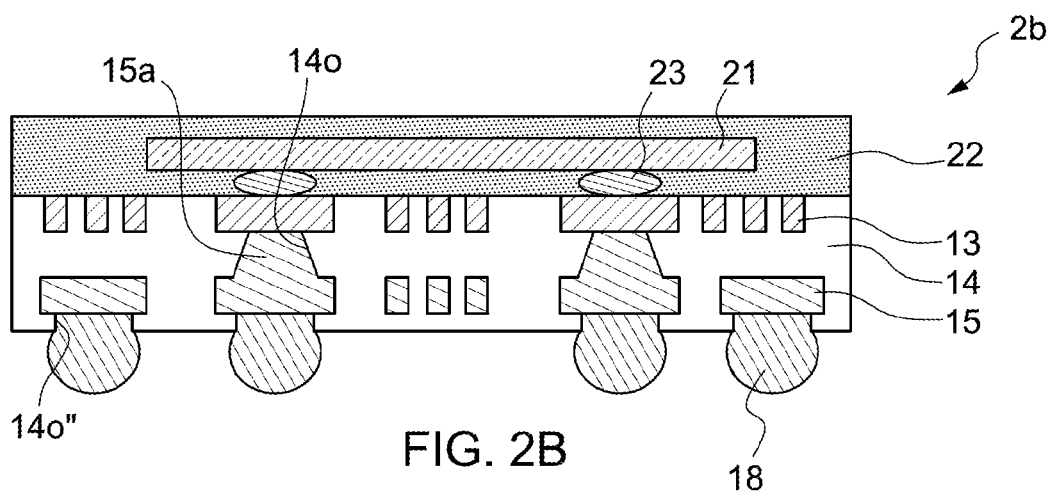
FIG. 2B is a schematic diagram of a semiconductor package structure according to another embodiment of the present disclosure.

FIG. 2B is a schematic diagram of a semiconductor package structure according to another embodiment of the present disclosure. As shown in FIG. 2B, a semiconductor package structure 2b has a structure similar to that of the semiconductor package structure 2a in FIG. 2A, and the differences are (1) the first dielectric layer 14 and the second dielectric layer 16 in the semiconductor package structure 2a are replaced with a single dielectric layer 14 in the semiconductor package structure 2b (similar to the embodiment described with respect to FIG. 1B), and (2) the solder balls 18 are disposed in respective openings 14o''' of the dielectric layer 14.

FIGS. 3A-3H are schematic diagrams of a method of making a semiconductor substrate according to an embodiment of the present disclosure.

Figure 3A:
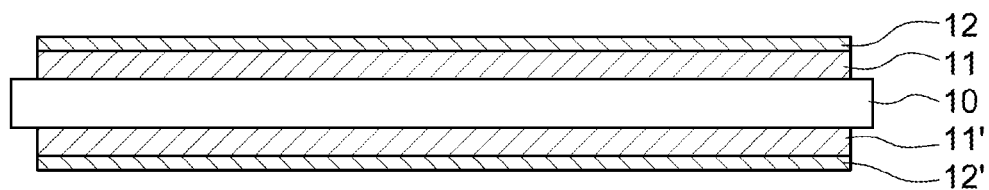
FIGS. 3A, 3B, 3C, 3D, 3E, 3F, 3G and 3H are schematic diagrams of a method of making a semiconductor substrate according to an embodiment of the present disclosure.

Referring to FIG. 3A, a loading plate 10 is provided. A first metal foil 11 and a second metal foil 12 are sequentially formed on one side of the loading plate 10, and a first metal foil 11' and a second metal foil 12' are sequentially formed on the opposite side of the loading plate 10.

The loading plate 10 may include, but is not limited to, a glass-reinforced epoxy material (e.g., an FR4 material) (e.g., composed of woven glass and epoxy resin).

The first metal foils 11, 11' and the second metal foils 12, 12' may be formed by plating, for example. The first metal foils 11, 11' and the second metal foils 12, 12' may include, but are not limited to, copper or other metal, or a metal alloy. The first metal foils 11 and 11' each have a thickness from about 3 μm to about 70 μm, such as about 3 μm to about 60 μm, about 3 μm to about 50 μm, about 3 μm to about 40 μm, about 3 μm to about 30 μm, about 3 μm to about 20 μm, about 3 μm to about 10 μm, about 3 μm to about 5 μm, about 5 μm to about 10 μm, about 10 μm to about 50 μm, or about 30 μm to about 70 μm. The second metal foils 12 and 12' each have a thickness from about 2 μm to about 35 μm, such as about 2 μm to about 30 μm, about 2 μm to about 20 μm, about 2 μm to about 10 μm, about 2 μm to about 5 μm, about 5 μm to about 20 μm, about 5 μm to about 30 μm, or about 5 μm to about 35 μm.

In one or more embodiments, the first metal foils 11, 11' and the second metal foils 12, 12', as well as the structures in FIGS. 3B to 3F to be described hereinafter, may be sequentially formed on two sides of the loading plate 10 (e.g., above and below the loading plate 10 shown in FIG. 3A) substantially concurrently using a double-sided process. In other embodiments, the first metal foil 11, the second metal foil 12 and the structures in FIGS. 3B to 3F to be described hereinafter may be first sequentially formed on one side of the loading plate 10 (e.g., above the loading plate 10 shown in FIG. 3A) using a single-sided process, and then the first metal foil 11', the second metal foil 12' and the structures in FIGS. 3B to 3F to be described hereinafter may be sequentially formed on the other side of the loading plate 10 (e.g., below the loading plate 10 shown in FIG. 3A) using a single-sided process.

Figure 3B:
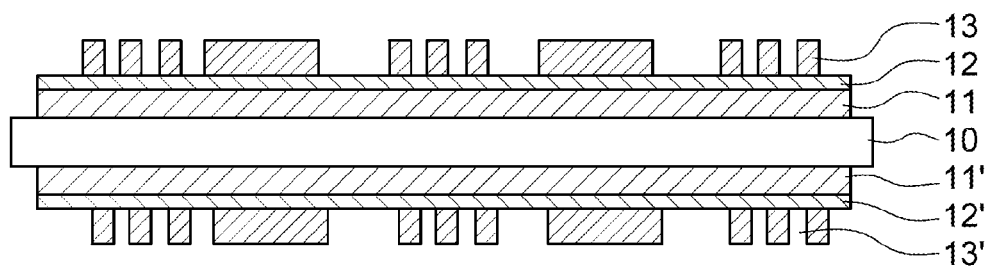

Referring to FIG. 3B, first patterned metal layers 13 and 13' are respectively formed on the second metal foil 12 and on the second metal foil 12'. The first patterned metal layers 13 and 13' may be formed, for example, using photo-lithography, plating and stripping. Photolithography may include, for example, coating, exposure and development, so as to form the first patterned metal layers 13 and 13' in a subsequent plating process. The first patterned metal layers 13 and 13' may include, but are not limited to, copper or other metal, or a metal alloy. A pitch of traces of the first patterned metal layer 13 or 13' may be equal to or less than about 15 μm, and a width of traces of the first patterned metal layer 13 or 13' may be equal to or less than about 15 μm. In one or more embodiments, a minimum trace pitch and a minimum trace width are approximately equal; however, in one or more other embodiments, a minimum trace pitch and a minimum trace width are unequal. The first patterned metal layers 13 and 13' each have a thickness from about 5 μm to about 20 μm (e.g., such as described with respect to the first patterned metal layer 13 in FIG. 1A).

Figure 3C:
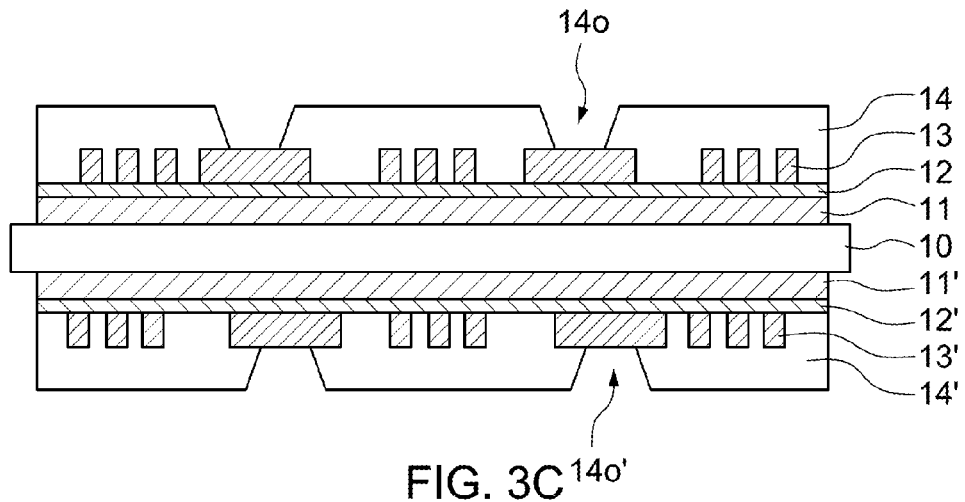

Referring to FIG. 3C, a first dielectric layer 14 is formed on the second metal foil 12 and the first patterned metal layer 13, and a first dielectric layer 14' is formed on the second metal foil 12' and the first patterned metal layer 13'.

The first patterned metal layer 13 is embedded into the first dielectric layer 14, and the first patterned metal layer 13' is embedded into the first dielectric layer 14'. The first dielectric layers 14 and 14' include respective multiple via openings 14o and 14o' to expose portions of the respective first patterned metal layers 13 and 13'.

The first dielectric layers 14 and 14' each have a thickness from about 10 μm to about 100 μm (e.g., such as described above with respect to the first dielectric layer 14 in FIG. 1A), and the via openings 14o and 14o' each have a diameter from about 10 μm to about 150 μm (e.g., such as described with respect to the first dielectric layer 14 in FIG. 1A). The first dielectric layers 14 and 14' may include, but are not limited to, one or more of a photosensitive material, such as a solder resist or a polyimide, a resin or another material which is applied in liquid or semi-liquid form and is cured during manufacturing, and a dry-film insulating material. In embodiments in which a photosensitive material is used, the photosensitive material may be laminated to surfaces of the second metal foils 12 and 12' so as to form the first dielectric layers 14 and 14', and the via openings 14o and 14o' may be formed in the first dielectric layers 14 and 14' by photo-lithography.

In an embodiment in which a liquid resin is used, the liquid resin may be coated to surfaces of the second metal foil 12, the first patterned metal layer 13, the second metal foil 12' and the first patterned metal layer 13' to form the first dielectric layers 14 and 14', and the via openings 14o and 14o' may be formed using a laser drilling technique.

Figure 3D:
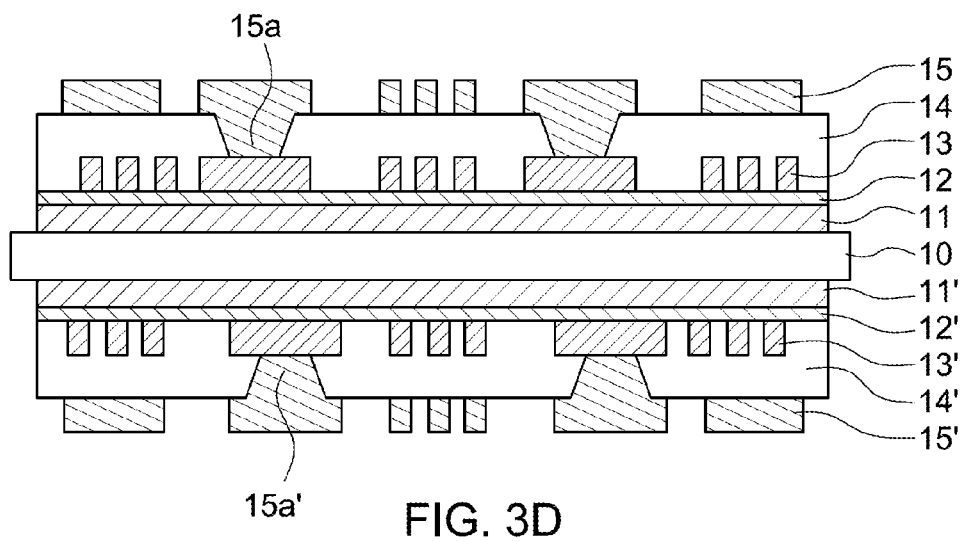

Referring to FIG. 3D, a second patterned metal layer 15 is formed on the first dielectric layer 14, and a second patterned metal layer 15' is formed on the first dielectric layer 14'.

In one or more embodiments, a seed layer (not shown) may be formed on exposed surfaces of the first patterned metal layers 13, 13' and the first dielectric layers 14 and 14'; then, the second patterned metal layers 15 and 15' are formed on the seed layer through processes such as photo-lithography, plating, stripping and etching.

The second patterned metal layers 15 and 15' may include, but is not limited to, copper or other metal, or a metal alloy. The second patterned metal layers 15 and 15' each have a thickness from about 5 μm to about 30 μm (e.g., such as described with respect to the second patterned metal layer 15 in FIG. 1A).

In one or more embodiments, the second patterned metal layer 15 is formed on the first dielectric layer 14 and in the via opening 14o, and the second patterned metal layer 15' is formed on the first dielectric layer 14' and in the via opening 14o', such that portions of the second patterned metal layers 15 and 15' formed in the via openings 14o and 14o' directly contact the first patterned metal layers 13 and 13' respectively.

Alternatively in FIG. 3D, in one or more embodiments, conductive materials 15a and 15a' may be formed in the via openings 14o and 14o' respectively; subsequently, a second patterned metal layer 15 is formed on the conductive material 15a, and a second patterned metal layer 15' is formed on the conductive material 15a', so as to use the conductive materials 15a and 15a' to respectively electrically connect the first patterned metal layers 13 and 13' and the second patterned metal layers 15 and 15'. The conductive materials 15a and 15a' may include, but are not limited to copper or other metal, or a metal alloy. The via openings 14o and 14o' may be respectively filled with the conductive materials 15a and 15a'.

Figure 3E:
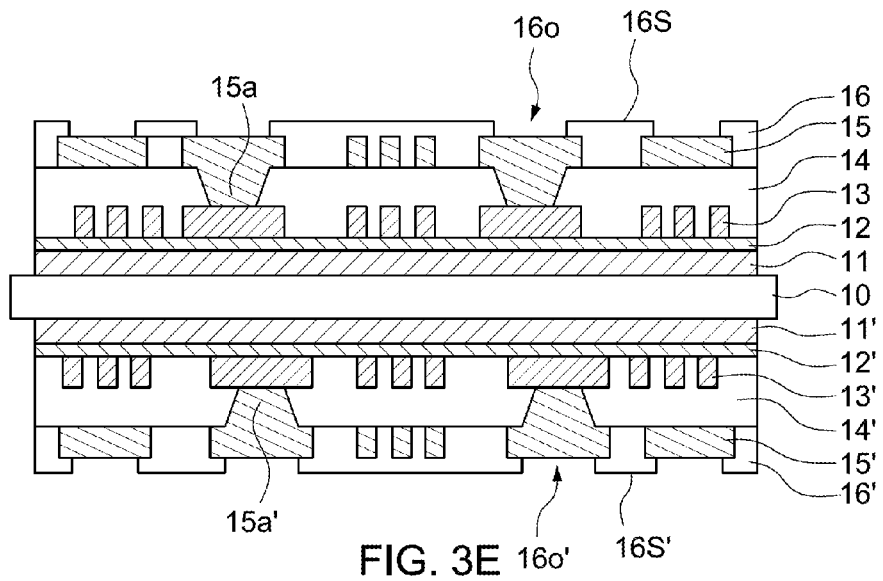

Referring to FIG. 3E, a second dielectric layer 16 is formed on the first dielectric layer 14 and the second patterned metal layer 15; and a second dielectric layer 16' is formed on the first dielectric layer 14' and the second patterned metal layer 15'.

The second dielectric layers 16 and 16' may include, but are not limited to, one or more of a photosensitive material, such as a solder resist or a polyimide, a resin or another material which is applied in liquid or semi-liquid form and is cured during manufacturing, and a dry-film insulating material. The second dielectric layer 16 may include one or more of the same materials as the first dielectric layer 14; however, some or all of the materials of the first dielectric layer 14 and the second dielectric layer 16 may be different.'

The second dielectric layers 16 and 16' include a number of first openings 16o and 16o'. The first openings 16o and 16o' may respectively expose part of the second patterned metal layers 15 and 15' directly contacting or electrically connecting the first patterned metal layers 13 and 13'. The second dielectric layers 16 and 16' each have a thickness from about 10 μm to about 30 μm (e.g., such as described with respect to the second dielectric layer 16 in FIG. 1A).

The first openings 16o and 16o' may respectively have a diameter from about 100 μm to about 1000 μm (e.g., such as described with respect to the first openings 16o in FIG. 1A). The first dielectric layer 14 and the second dielectric layer 16 together have a total thickness from about 30 μm to about 180 μm, such as about 30 μm to about 150 μm, about 30 μm to about 100 μm, about 30 μm to about 50 μm, about 50 μm to about 180 μm, about 100 μm to about 180 μm, or about 150 μm to about 180 μm.

Figure 3F:
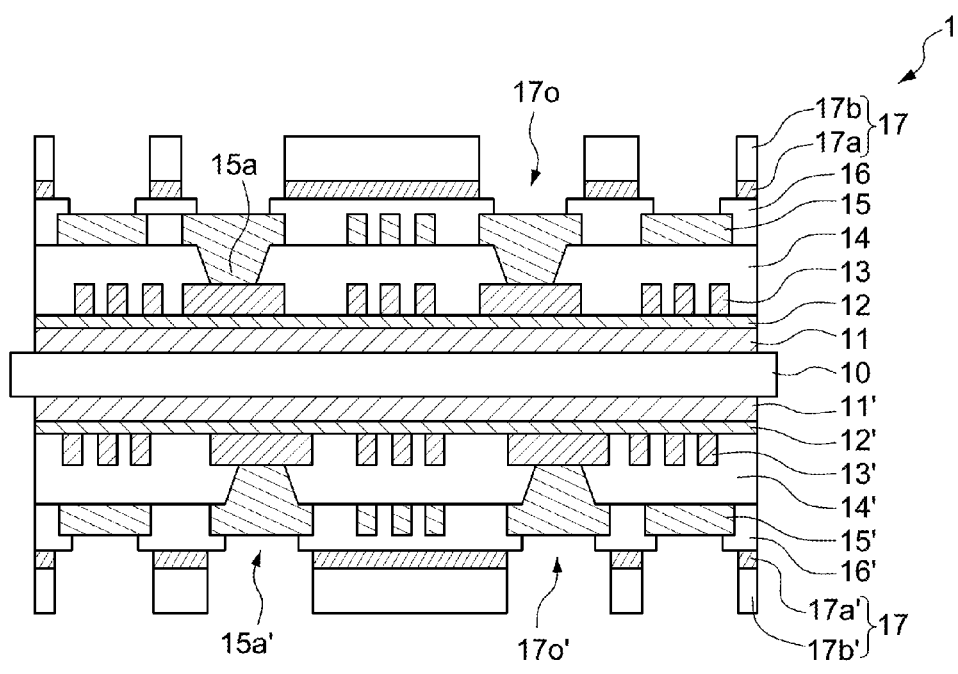

Referring to FIG. 3F, a carrier layer 17 is formed above the second dielectric layer 16, and a carrier layer 17' is formed below the second dielectric layer 16'.

The carrier layers 17 and 17' may be single-layer or multi-layer structures. For example, the carrier layer 17 may include at least one third patterned metal layer 17a and a supporting layer 17b, and the carrier layer 17' may include at least one third patterned metal layer 17a' and a supporting layer 17b'. The third patterned metal layers 17a and 17a' may include, but are not limited to, copper or other metal, or a metal alloy, and may have a thickness from about 2 μm to about 7 μm (e.g., such as described with respect to the third patterned metal layer 17a in FIG. 1A). The supporting layers 17b and 17b' may include, but are not limited to, BT resin or a glass-reinforced epoxy material (e.g., an FR4 material), and may have a thickness from about 40 μm to about 400 μm (e.g., such as described with respect to the supporting layer 17b in FIG. 1A).

The carrier layers 17 and 17' may be formed in advance; for example, patterned carrier layers 17 and 17' may be formed on the carrier layers 17 and 17' such as by using a drilling machine.

The patterned carrier layers 17 and 17' may be closely attached or laminated to surfaces of the second dielectric layers 16 and 16' respectively. In one or more embodiments, the second dielectric layers 16 and 16' are thermally cured in a range of about 80° C. to about 120° C.; however, the curing temperature typically does not exceed a glass transition temperature (Tg) of the second dielectric layers 16 and 16'. In this manner, the patterned carrier layers 17 and 17' may be attached to the surfaces of the second dielectric layers 16 and 16', respectively, by an adhesive force between the third patterned metal layers 17a and 17a' and the second dielectric layers 16 and 16', and a surface roughness of the second dielectric layers 16 and 16' will be determined by a surface roughness of the patterned carrier layers 17 and 17'.

The carrier layers 17 and 17' include second openings 17o and 17o' that expose portions of the second patterned metal layers 15 and 15' respectively. The position of each of the second openings 17o and 17o' substantially corresponds to a position of a respective first opening 16o or 16o'. For example, a position of the center of a second opening 17o or 17o' aligns with a position of a center of the respective first opening 16o and 16o'. A diameter of each of the second openings 17o and 17o' is greater than or equal to a diameter of the respective first opening 16o or 16o'. The second openings 17o and 17o' may have diameters from about 100 μm to about 1500 µm respectively (e.g., such as described with respect to the second opening 17a in FIG. 1A).

As shown in FIG. 3F, it is possible to form a semiconductor substrate 1 in an embodiment of the present disclosure on the first metal foil 11 and form a semiconductor substrate 1' in an embodiment of the present disclosure on the first metal foil 11'. The semiconductor substrates 1 and 1' may have substantially the same structures. Each of the semiconductor substrates 1 and 1' may have a total thickness from about 80 µm to about 800 µm, such as about 80 µm to about 700 µm, about 80 µm to about 600 µm, about 80 µm to about 500 µm, about 80 µm to about 400 µm, about 80 µm to about 300 µm, about 80 µm to about 200 µm, about 80 µm to about 100 µm, about 100 µm to about 400 µm, about 200 µm to about 500 µm, about 300 µm to about 600 µm, about 400 µm to about 700 µm, or about 500 µm to about 800 µm.

Figure 3G:
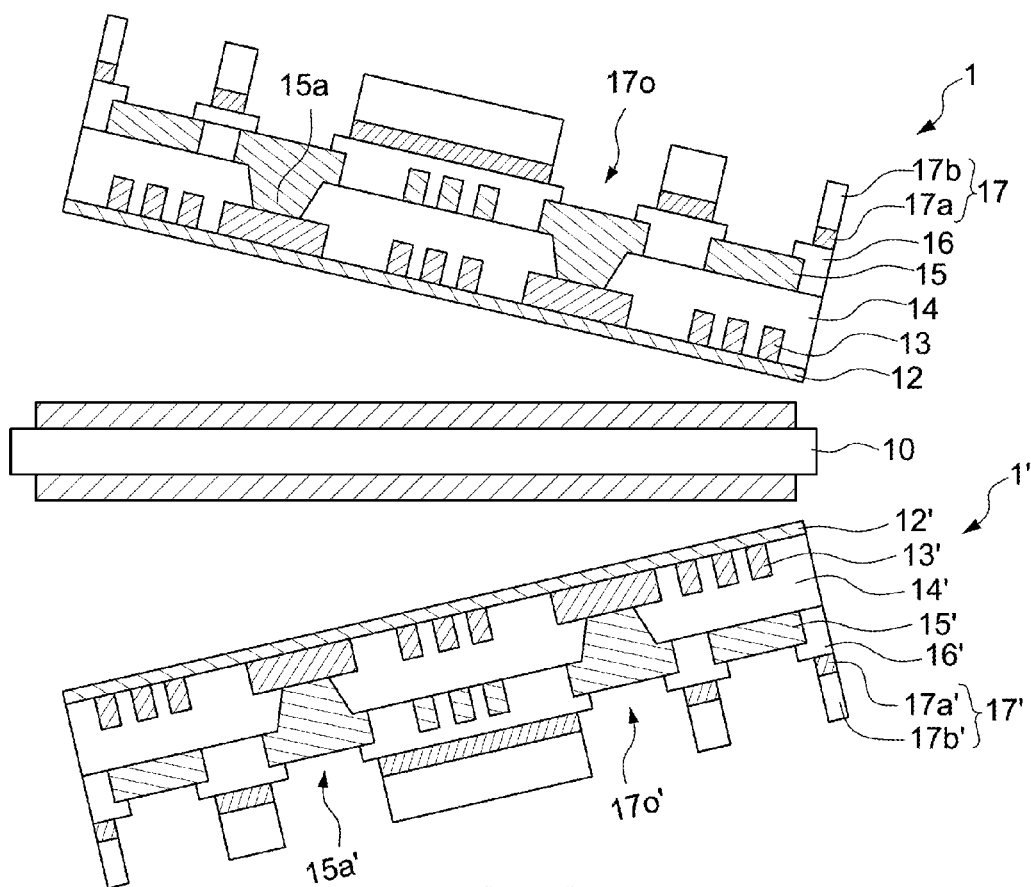
Figure 3H:
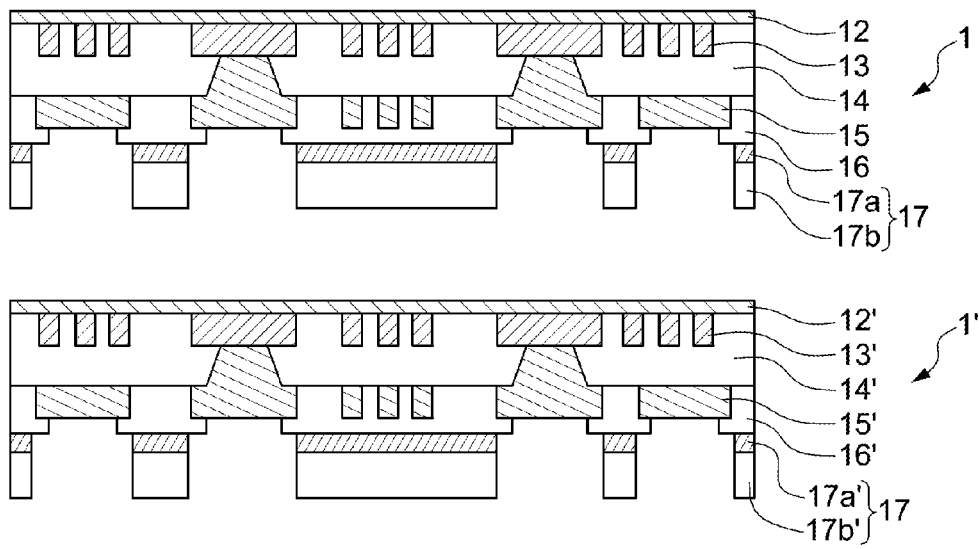

Referring to FIG. 3G and FIG. 3H, in FIG. 3G, the semiconductor substrates 1 and 1' may be separated from the first metal foils 11 and 11' respectively to form the semiconductor substrates 1 and 1' in FIG. 3H. Forces may be respectively applied to the supporting layers 17b and 17b' so as to separate the semiconductor substrates 1 and 1' from the first metal foils 11 and 11' without damaging the substrates 1 and 1'.

The second metal foils 12 and 12' of the respective semiconductor substrates 1 and 1' in FIG. 3H may be removed, for example, by etching, so as to form two semiconductor structures such as the semiconductor substrate 1a' shown in FIG. 1A.

In one or more embodiments of the present disclosure, the semiconductor substrates 1 and 1' are supported by respective patterned carrier layers 17b and 17b', and upper and lower probes (not shown) respectively contact the first patterned metal layers 13 and 13' and the second patterned metal layers 15 and 15' so as to conduct an electrical test.

Figure 3I:
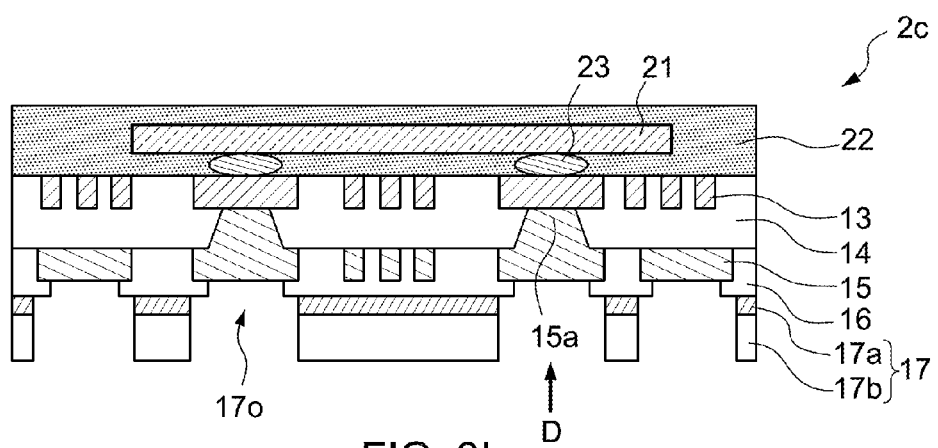
FIG. 3I is a schematic diagram of a semiconductor package structure according to an embodiment of the present disclosure.

FIG. 3I is a schematic diagram of a semiconductor package structure according to one or more embodiments of the present disclosure.

In FIG. 3I, a package technology may be used, for example, a flip chip technology, to electrically connect a die 21 to the semiconductor substrate 1a in FIG. 1A (e.g., a semiconductor substrate 1 or 1' as shown in FIG. 3H) so as to form a package structure 2c. Connecting elements 23 formed on the die 21 may be bonded to the first patterned metal layer 13, and then through a molding process, a molding compound 22 is used to encapsulate the die 21 and part of the connecting elements 23 so as to form the package structure 2c. The carrier layer 17 provides support for, and may protect, the semiconductor substrate (e.g., 1, 1', 1a) during packaging.

The connecting elements 23 may be, but are not limited to, a copper pillar or a solder bump.

Figure 3J:
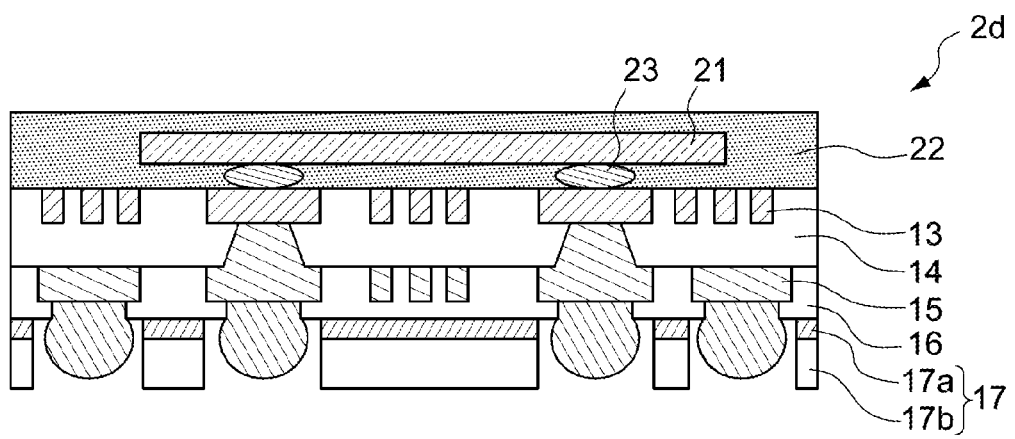
FIG. 3J is a schematic diagram of a semiconductor package structure according to another embodiment of the present disclosure.

FIG. 3J is a schematic diagram of a semiconductor package structure according to another embodiment of the present disclosure. In FIG. 3J, ball mount or printing technology is used to form solder balls 18 in respective first openings 16o and second openings 17o of the package structure 2c in FIG. 3I, to form a package structure 2d.

It is noted that a steel stencil is generally used to abut against the semiconductor substrate for ball mount or printing technology. However, because there is a gap between the steel stencil and the semiconductor substrate, a flux used during the ball mount or printing process will easily flow into the gap between the steel stencil and the semiconductor substrate, which leads to a short circuit caused when solder ball flows along with the flux. In an embodiment of the present disclosure, because the patterned carrier layer 17 is closely attached to the second dielectric layer 16, the solder balls 18 can be formed in the first openings 16o and the second openings 17o relatively accurately, so that the steel stencil is not needed to align with the first openings 16o and the second openings 17o during ball mount or printing, and thus the short circuit of the package structure 2d can be prevented.

The patterned carrier layer 17 may be removed from the package structure 2d in FIG. 3J by means of a physical or mechanical force (e.g., tearing) so as to form the package structure 2a shown in FIG. 2A.

Figure 4:
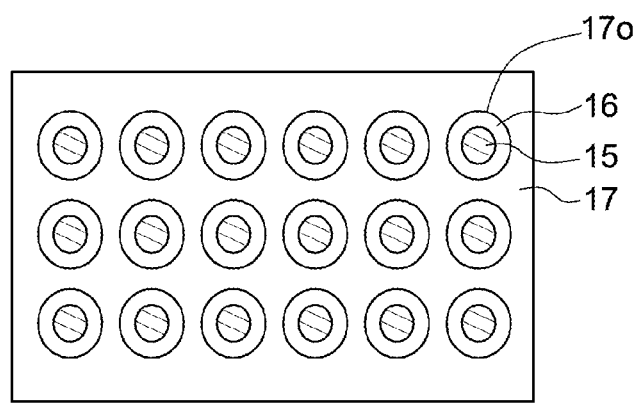
FIG. 4 is a schematic diagram of the package structure 2a in FIG. 3I along a direction D.

FIG. 4 is a schematic diagram of the package structure 2c in FIG. 3I along a direction D. It can be seen from FIG. 4 that the second openings 17o of the carrier layer 17 expose portions of the second dielectric layer 16 and the second patterned metal layer 15.

Figure 5:
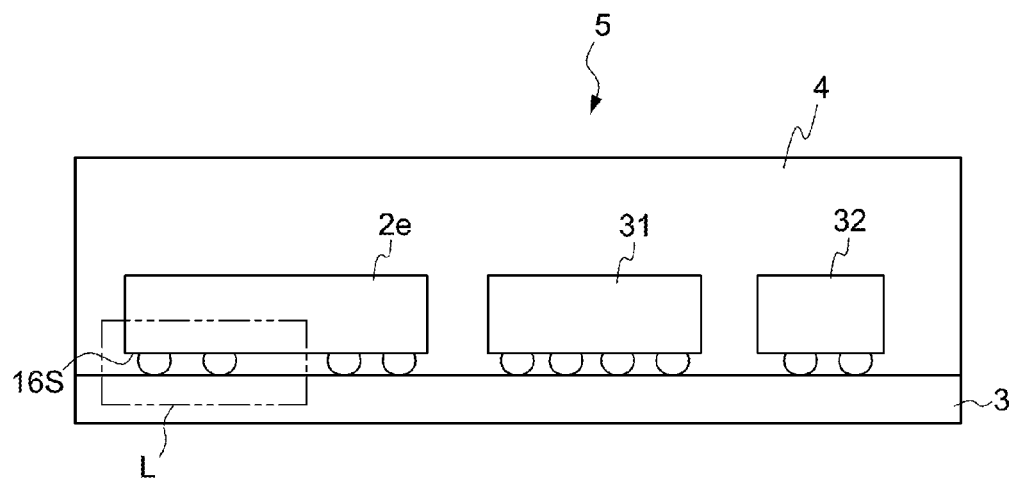
FIG. 5 is a schematic diagram of a module including a semiconductor package structure according to an embodiment of the present disclosure.

FIG. 5 is a schematic diagram of a module including a semiconductor package structure according to one or more embodiments of the present disclosure. As shown in FIG. 5, a module 5 may include a substrate 3, a semiconductor package structure 2e, components 31 and 32, and a molding compound 4.

The module 5 may be, for example, a communications module, a display module or the like. The semiconductor package structure 2e may be the same as the semiconductor package structure 2a shown in FIG. 2A, or may be another semiconductor package structure according to this disclosure. The components 31 and 32 may be active components, passive components, or other semiconductor package structures, which may be similar to or different than the semiconductor package structure 2e.

The semiconductor package structure 2e, the component 31 and the component 32 are disposed on the substrate 3, and the molding compound 4 encapsulates surfaces of the semiconductor package structure 2e, the component 31, the component 32 and the substrate 3.

Figure 5A:
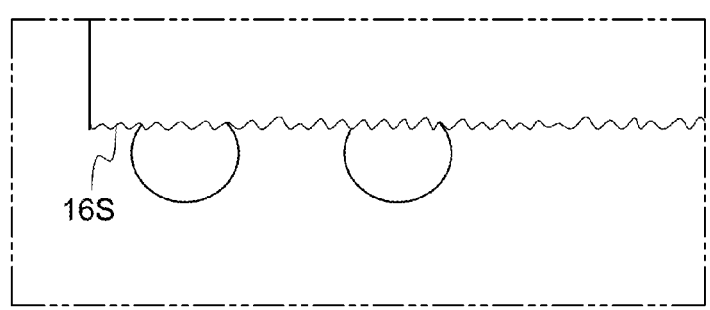
FIG. 5A is an enlarged diagram of the Region L in FIG. 5.

FIG. 5A is an enlarged diagram of the Region L in FIG. 5. As shown in FIG. 5A, during manufacturing of the semiconductor package structure 2e due to removing the carrier layer 17 from the package structure 2d (referring to FIG. 3J), the surface roughness of the lower surface 16S of the second dielectric layer 16 is increased.

For example, in FIG. 3E, the lower surface 16S of the second dielectric layer 16 may have a surface roughness from about 0.09 µm to about 0.15 µm; whereas after removing the carrier layer (FIG. 3J), the lower surface 16S of the second dielectric layer 16 has surface roughness greater than about 0.15 µm.

As shown in FIG. 5A, the lower surface 16S of the second dielectric layer is a relatively uneven rough surface. The relatively uneven surface 16S may increase a binding force between the molding compound 4 and the semiconductor package structure 2e by encapsulating the semiconductor package structure 2e with the molding compound 4.

As used herein and not otherwise defined, the terms "substantially" and "about" are used to describe and account for small variations. When used in conjunction with an event or circumstance (e.g., "substantially concurrently"), the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is no greater than 1 µm, no greater than 5 µm, no greater than 10 µm, or no greater than 15 µm. For another example, two substantially corresponding positions align along a line or along a plane, with a displacement from the line or plane being a displacement of no greater than about 5 µm, such as no greater than about 4 µm, no greater than about 3 µm, no greater than about 2 µm, or no greater than about 1 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, subdivided, or re-ordered to form an equivalent method without departing from the teachings of the present disclosure. Accordingly, unless specifically indicated herein, the order and grouping of the operations are not limitations of the present disclosure.

What is claimed is:

1. A method of making a semiconductor substrate, comprising:
    providing a substrate, the substrate comprising:
        a first patterned metal layer;
        a second patterned metal layer spaced from the first patterned metal layer;
        a dielectric layer disposed between the first patterned metal layer and the second patterned metal layer and covering the second patterned metal layer, wherein the dielectric layer defines first openings exposing the second patterned metal layer, and the dielectric layer further defines a via opening extending from the first patterned metal layer to the second patterned metal layer; and
        a conductive material disposed in the via opening and electrically connecting the first patterned metal layer to the second patterned metal layer; and
    providing a carrier layer on the dielectric layer, wherein the carrier layer defines second openings exposing the second patterned metal layer.

2. The method of making a semiconductor substrate according to claim 1, wherein the carrier layer further comprises a third patterned metal layer and a supporting layer, the third patterned metal layer abutting the dielectric layer, and the supporting layer abutting the third patterned metal layer.

3. The method of making a semiconductor substrate according to claim 1, wherein the dielectric layer comprises a first dielectric sub-layer and a second dielectric sub-layer, the first dielectric sub-layer being disposed between the first patterned metal layer and the second patterned metal layer, the second dielectric sub-layer abutting the first dielectric sub-layer and covering the second patterned metal layer, and the second dielectric sub-layer defining the first openings exposing the second patterned metal layer.

4. The method of making a semiconductor substrate according to claim 1, wherein the dielectric layer is a photosensitive material.

5. The method of making a semiconductor substrate according to claim 1, wherein providing a substrate comprises:
    forming the first patterned metal layer on a metal foil;
    forming a first dielectric sub-layer on the first patterned metal layer and the metal foil;
    forming the second patterned metal layer on the first dielectric sub-layer, and electrically connecting the second patterned metal layer to the first patterned metal layer; and
    forming a second dielectric sub-layer on the second patterned metal layer and the first dielectric sub-layer, wherein the first dielectric sub-layer and the second dielectric sub-layer fuse to form the dielectric layer.

6. The method of making a semiconductor substrate according to claim 5, wherein providing a substrate further comprises, subsequent to forming the first dielectric sub-layer, forming via openings in the first dielectric sub-layer to expose part portions of the first patterned metal layer.

7. The method of making a semiconductor substrate according to claim 1, wherein a diameter of each of the second openings is greater than or equal a diameter of a respective one of the first openings.

8. A method of making a semiconductor package structure, comprising:
    providing a semiconductor substrate, the semiconductor substrate comprising:
        a first patterned metal layer;
        a second patterned metal layer spaced from the first patterned metal layer;
        a dielectric layer disposed between the first patterned metal layer and the second patterned metal layer and covering the second patterned metal layer, wherein the dielectric layer defines first openings exposing the second patterned metal layer, and the dielectric layer further defines a via opening extending from the first patterned metal layer to the second patterned metal layer;
        a conductive material disposed in the via opening and electrically connecting the first patterned metal layer to the second patterned metal layer; and
        a carrier layer abutting the dielectric layer, the carrier layer defining second openings exposing the second patterned metal layer;
    electrically connecting a die to the first patterned metal layer; and
    removing the carrier layer.

9. The method of making a semiconductor package structure according to claim 8, wherein the carrier layer comprises a third patterned metal layer and a supporting layer, the third patterned metal layer abuts the dielectric layer, and the supporting layer abuts the third patterned metal layer.

10. The method of making a semiconductor package structure according to claim 8, wherein the dielectric layer comprises a first dielectric sub-layer and a second dielectric sub-layer, the first dielectric sub-layer being disposed between the first patterned metal layer and the second patterned metal layer, the second dielectric sub-layer abuts the first dielectric sub-layer and covers the second patterned metal layer, and the second dielectric sub-layer defines the first openings exposing the second patterned metal layer.

11. The method of making a semiconductor package structure according to claim 8, wherein before removing the carrier layer, the method further comprises: forming solder balls in the first openings and the second openings.

12. The method of making a semiconductor package structure according to claim 8, wherein the first patterned metal layer is embedded in the dielectric layer and exposed from the dielectric layer.

13. The method of making a semiconductor package structure according to claim 8, wherein the dielectric layer is a photosensitive material.

14. The method of making a semiconductor package structure according to claim 8, wherein before removing the carrier layer, the method further comprises: forming a molding compound to cover the die.

15. The method of making a semiconductor package structure according to claim 8, wherein a diameter of each of the second openings is greater than or equal to a diameter of a corresponding one of the first openings.

16. A method, comprising:
providing a substrate;
applying a carrier layer to the substrate, wherein the carrier layer defines openings exposing portions of the substrate;
disposing solder on the substrate within ones of the openings in the carrier layer; and
removing the carrier layer;
wherein the substrate comprises a dielectric layer, a first patterned metal layer embedded in a first surface of the dielectric layer, a second patterned metal layer embedded in the dielectric layer and partially exposed from a second surface of the dielectric layer, and a conductive material disposed in an opening through the dielectric layer, the conductive material electrically connecting the first patterned metal layer and the second patterned metal layer; and
wherein the exposed portions of the substrate include portions of the second patterned metal layer partially exposed from the dielectric layer, and the solder is disposed on the second patterned metal layer.

17. The method according to claim 16, wherein the second patterned metal layer is recessed from the second surface of the dielectric layer.

18. The method according to claim 16, wherein the dielectric layer comprises a plurality of dielectric layers, the first patterned metal layer is disposed in a first of the dielectric layers, and the second patterned metal layer is disposed in a second of the dielectric layers.

19. The method according to claim 16, wherein providing the substrate comprises applying a first amount of a dielectric material over the first patterned metal layer, disposing the second metal layer on the dielectric material and through openings defined by the dielectric material, applying a second amount of the dielectric material over the second metal layer, and curing the dielectric material to form the dielectric layer.

20. The method according to claim 16, wherein providing the substrate comprises providing a loading plate with the substrate disposed on a side of the loading plate, further comprising separating the substrate from the loading plate, attaching a die to the substrate at the first surface of the substrate, and encapsulating the die and the first surface of the substrate.

* * * * *